(12) United States Patent
Doherty et al.

(10) Patent No.: US 8,197,172 B2
(45) Date of Patent: *Jun. 12, 2012

(54) AUTOMATED MATERIAL HANDLING SYSTEM FOR SEMICONDUCTOR MANUFACTURING BASED ON A COMBINATION OF VERTICAL CAROUSELS AND OVERHEAD HOISTS

(75) Inventors: Brian J. Doherty, Weston, MA (US); Thomas R. Mariano, Londonderry, NH (US); Robert P. Sullivan, Wilmington, MA (US)

(73) Assignee: Murata Machinery, Ltd., Kyoto (JP)

( * ) Notice: Subject to any disclaimer, the term of this patent is extended or adjusted under 35 U.S.C. 154(b) by 172 days.

This patent is subject to a terminal disclaimer.

(21) Appl. No.: 12/724,194

(22) Filed: Mar. 15, 2010

(65) Prior Publication Data

US 2010/0174405 A1 Jul. 8, 2010

Related U.S. Application Data

(63) Continuation of application No. 11/652,707, filed on Jan. 12, 2007, now Pat. No. 7,771,153, which is a continuation of application No. 10/393,526, filed on Mar. 20, 2003, now Pat. No. 7,165,927.

(60) Provisional application No. 60/389,993, filed on Jun. 19, 2002, provisional application No. 60/417,993, filed on Oct. 11, 2002.

(51) Int. Cl.
*H01L 21/00* (2006.01)
*G06F 19/00* (2011.01)

(52) U.S. Cl. .................................. 414/331.02

(58) Field of Classification Search ............ 414/331.02, 414/331.03, 331.14, 318, 935
See application file for complete search history.

(56) References Cited

U.S. PATENT DOCUMENTS 3,700,121 A 10/1972 McManus
(Continued)

FOREIGN PATENT DOCUMENTS

EP 1 202 325 5/2002
(Continued)

OTHER PUBLICATIONS

Campbell, "Overhead Intrabay Automation and Microstocking —a virtual fab case study," *IEEE/SEMI Advance dSemiconductor Manufacturing Conference*, pp. 368-372 (1997).

(Continued)

*Primary Examiner* — Charles A Fox
(74) *Attorney, Agent, or Firm* — Fish & Richardson P.C.

(57) ABSTRACT

A highly efficient Automated Material Handling System (AMHS) that allows an overhead hoist transport vehicle to load and unload Work-In-Process (WIP) parts directly to/from one or more WIP storage units included in the system. The AMHS includes an overhead hoist transport subsystem and at least one vertical carousel stocker having a plurality of storage bins. The overhead hoist transport subsystem includes an overhead hoist transport vehicle traveling along a suspended track defining a predetermined route, which runs adjacent to the carousel stocker, thereby allowing the overhead hoist transport vehicle to access a WIP part directly from one of the storage bins. At least one of the storage bins includes a movable shelf operative to move laterally from a first position along the carousel path to a second position near the overhead hoist transport vehicle. The storage unit is at least partially open to allow the movable shelf to move to the second position, thereby allowing the overhead hoist to access a material unit directly from the movable shelf for subsequent transport along the track between various locations within a product manufacturing facility.

20 Claims, 7 Drawing Sheets

U.S. PATENT DOCUMENTS

| | | | |
|---|---|---|---|
| 3,883,203 A | 5/1975 | Lexe | |
| 4,676,560 A | 6/1987 | Schmitz et al. | |
| 4,801,236 A | 1/1989 | Katzenschwanz | |
| 5,980,183 A | 11/1999 | Fosnight | |
| 6,068,437 A | 5/2000 | Boje et al. | |
| 6,092,678 A | 7/2000 | Kawano et al. | |
| 6,113,341 A | 9/2000 | Fukushima | |
| 6,129,496 A | 10/2000 | Iwasaki et al. | |
| 6,183,184 B1 | 2/2001 | Shiwaku | |
| 6,453,574 B1 | 9/2002 | Chen | |
| 6,504,144 B1 | 1/2003 | Murata | |
| 6,579,052 B1 | 6/2003 | Bonora et al. | |
| 6,604,624 B2 | 8/2003 | Hirata et al. | |
| 6,695,120 B1 | 2/2004 | Trammell | |
| 6,715,978 B2 | 4/2004 | Lin et al. | |
| 6,726,429 B2 | 4/2004 | Sackett et al. | |
| 6,881,020 B2 | 4/2005 | Chang et al. | |
| 7,165,927 B2 * | 1/2007 | Doherty et al. | 414/331.02 |
| 7,441,999 B2 * | 10/2008 | Nakao et al. | 414/217.1 |
| 7,686,176 B2 * | 3/2010 | Murata | 212/332 |
| 7,771,153 B2 * | 8/2010 | Doherty et al. | 414/331.02 |
| 2002/0143427 A1 | 10/2002 | Chao | |
| 2002/0197136 A1 | 12/2002 | Huang et al. | |
| 2003/0156928 A1 | 8/2003 | Sackett et al. | |
| 2003/0198540 A1 | 10/2003 | Lin et al. | |
| 2004/0109746 A1 * | 6/2004 | Suzuki | 414/373 |
| 2004/0126208 A1 * | 7/2004 | Tawyer et al. | 414/222.02 |

FOREIGN PATENT DOCUMENTS

| | | |
|---|---|---|
| JP | 3-225847 | 10/1991 |
| JP | 5-77183 | 10/1993 |
| JP | 10-45213 | 2/1998 |
| JP | 2000-053237 | 2/2000 |
| JP | 2000-53237 | 2/2000 |
| JP | 2000- 289975 | 10/2000 |
| JP | 2001-31216 | 2/2001 |
| WO | WO 98/46503 | 3/1998 |
| WO | WO 00/37338 | 6/2000 |
| WO | WO 01/13408 | 2/2001 |
| WO | WO 01/96884 | 12/2001 |

OTHER PUBLICATIONS

Kaempf, "Automated Wafer Transport in the Wafer Fab," *IEEE/SEMI Advanced Semiconductor Manufacturing Conference*, pp. 356-361 (1997).

Kuo, "Modelling and Performance Evaluation of an Overhead Hoist Trasnport System in a 300 mm Fabrication Plant," *Int. J. Adv. Manuf. Technol.*, vol. 20, pp. 153-161 (2002).

Sikich, "Development and Implementation of an Automated Wafer Transport System," *IEEE/SEMI Advanced Semiconductor Manufacturing Conference*, pp. 400-404 (1998).

Office Action from Patent Application No. JP 2004-515615, dated Mar. 22, 2011.

* cited by examiner

AUTOMATED MATERIAL HANDLING SYSTEM FOR SEMICONDUCTOR MANUFACTURING BASED ON A COMBINATION OF VERTICAL CAROUSELS AND OVERHEAD HOISTS

CLAIM OF PRIORITY

This application is a continuation of and claims priority under 35 U.S.C. §120 to U.S. Pat. No. 7,771,153 11/652,707, filed Jan. 12, 2007 and entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS," which is a continuation of and claims priority under 35 U.S.C. §120 to U.S. Pat. No. 7,165,927 10/393,526, filed Mar. 20, 2003 and entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS," which claims priority under 35 USC §119(e) to U.S. Provisional Patent Application No. 60/389,993, filed Jun. 19, 2002 and entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS," and U.S. Provisional Patent Application No. 60/417,993, filed Oct. 11, 2002 and entitled "OFFSET ZERO FOOTPRINT STORAGE (ZFS) USING MOVING SHELVES OR A TRANSLATING HOIST PLATFORM," the entire contents of each of which are hereby incorporated by reference.

BACKGROUND OF THE INVENTION

The present invention relates generally to automated material handling systems, and more specifically to an automated material handling system that allows an overhead hoist to access work-in-process (WIP) parts directly from a WIP storage unit to increase the efficiency of the overall material handling system.

Automated material handling systems are known that employ WIP storage units and overhead hoists to store and transport WIP parts between various workstations and/or processing machines in a product manufacturing environment. For example, such an Automated Material Handling System (AMHS) is commonly employed in the manufacturing of Integrated Circuit (IC) chips. A typical process for fabricating an IC chip comprises various steps including deposition, cleaning, ion implantation, etching, and passivation steps. Further, each of these steps in the IC chip fabrication process is usually performed by a different processing machine such as a chemical vapor deposition chamber, an ion implantation chamber, or an etcher. Accordingly, the WIP parts, e.g., semiconductor wafers, are typically transported between the different workstations and/or processing machines multiple times to perform the various process steps required for fabricating the IC chips.

A conventional AMHS for manufacturing IC chips comprises a plurality of WIP storage units (also known as "stockers") for storing the semiconductor wafers, and one or more overhead hoist transport vehicles for transporting the wafers between the various workstations and processing machines on the IC chip manufacturing floor. The semiconductor wafers stored in the WIP stockers are typically loaded into cassette pods such as Front Opening Unified Pods (FOUPs), which are subsequently transferred to an overhead transport vehicle configured to travel on a suspended track. In the conventional AMHS, each stocker is typically provided with a plurality of active input/output ports that work in conjunction with an internal robotic arm (which may provide up to three or more axes of movement) for loading and unloading the FOUPs to/from the stocker. The FOUPs are picked and placed from/to the input/output ports by the overhead hoist vehicle.

One drawback of the conventional AMHS is that the efficiency of the overall system is limited by the time required for the robotic arm to access the FOUPs at the WIP stocker's active input/output ports. Because of the generally delicate nature of the semiconductor wafers, strict limits are normally imposed on the acceleration rate of the robotic arm. For this reason, a minimum amount of time is typically required for moving the FOUPs to and from the stocker's input/output ports. This minimum move time generally determines the stocker throughput, which dictates the number of stockers needed to support the desired IC chip production level and thus the total cost of the AMES. Although the material handling efficiency of the AMHS might be improved by increasing the number of active input/output ports on each stocker and by allowing the overhead transport vehicle to access multiple input/output ports simultaneously, providing additional input/output ports can significantly increase the cost of the stocker.

In addition, the combination of a three or more axis internal robot in the stocker with several input/output ports, each having 1-3 axes of motion, means that a typical stocker may have between 5 and 16 axes of motion. This is a very complex, low reliability, and costly solution for storing material.

It would therefore be desirable to have an automated material handling system that provides enhanced material handling efficiency while overcoming the drawbacks of conventional automated material handling systems.

BRIEF SUMMARY OF THE INVENTION

In accordance with the present invention, a highly efficient Automated Material Handling System (AMHS) is provided that allows an overhead hoist to load and unload Work-In-Process (WIP) parts directly to/from one or more WIP storage units included in the system.

In one embodiment, the improved AMHS comprises an overhead hoist transport subsystem and at least one vertical carousel WIP storage unit ("stocker") including a plurality of storage bins. The overhead hoist transport subsystem includes at least one overhead hoist transport vehicle configured to travel along a suspended track defining at least one predetermined route. The predetermined route passes over the vertical carousel stocker, which is configured to allow the overhead hoist to access one or more WIP parts directly from a selected one of the carousel storage bins. In this first embodiment, the selected carousel storage bin containing the desired WIP lot(s) is positioned at the top of the vertical carousel stocker substantially directly underneath the suspended track. Next, the overhead hoist transport vehicle is moved along the suspended track to a position substantially directly above the selected carousel storage bin. The overhead hoist is then lowered toward the selected storage bin. Finally, the overhead hoist is operated to pick the desired WIP lot directly from the carousel storage bin, or to place one or more WIP lots in the carousel storage bin.

In a second embodiment, the predetermined route defined by the suspended track passes parallel to the vertical carousel WIP stocker, which is configured to allow the overhead hoist to access one or more WIP parts directly from one of the carousel storage bins. The AMHS further includes an extraction mechanism, which works in conjunction with the vertical carousel stocker to suitably position the selected carousel storage bin containing the desired WIP lot(s) relative to the track. For example, the extraction mechanism may be configured to move the selected carousel storage bin (e.g., a movable shelf) along a single servo-controlled axis from a first position adjacent the track to a second position substantially directly underneath the track. In the second embodiment, the overhead transport vehicle is moved along the track to a position substantially directly above the second position. Next, the overhead hoist is lowered toward the second position. In an alternative embodiment, the selected carousel storage bin comprises a shelf positioned alongside the track, and the overhead hoist is mounted to a translating stage for picking and placing one or more WIP lots to the shelf at the side of the overhead transport vehicle. Finally, the overhead hoist is operated to pick the desired WIP lot directly from the selected storage bin, or to place one or more WIP lots in the selected storage bin.

By configuring the AMHS to allow the overhead hoist to directly load and unload WIP parts to/from the carousel storage bins from a position above the respective storage bin, more efficient AMHS operation can be achieved.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

The entire disclosures of U.S. patent application No. Ser. No. 10/393,526 filed Mar. 20, 2003 entitled AUTOMATED MATERIAL HANDLING SYSTEM FOR SEMICONDUCTOR MANUFACTURING BASED ON A COMBINATION OF VERTICAL CAROUSELS AND OVERHEAD HOISTS, U.S. Provisional Patent Application No. 60/389,993 filed Jun. 19, 2002 entitled AUTOMATED MATERIAL HANDLING SYSTEM FOR SEMICONDUCTOR MANUFACTURING BASED ON A COMBINATION OF VERTICAL CAROUSELS AND OVERHEAD HOISTS, and U.S. Provisional Patent Application No. 60/417,993 filed Oct. 11, 2002 entitled OFFSET ZERO FOOTPRINT STORAGE (ZFS) USING MOVING SHELVES OR A TRANSLATING HOIST PLATFORM, are incorporated herein by reference.

An Automated Material Handling System (AMHS) is disclosed that can load and unload Work-In-Process (WIP) parts to/from a WIP storage unit with increased efficiency. The presently disclosed AMHS achieves such increased material handling efficiency by allowing top-loading/unloading of storage bins in a vertical carousel WIP storage unit by an overhead hoist positioned above the respective storage bin.

Figure 1:
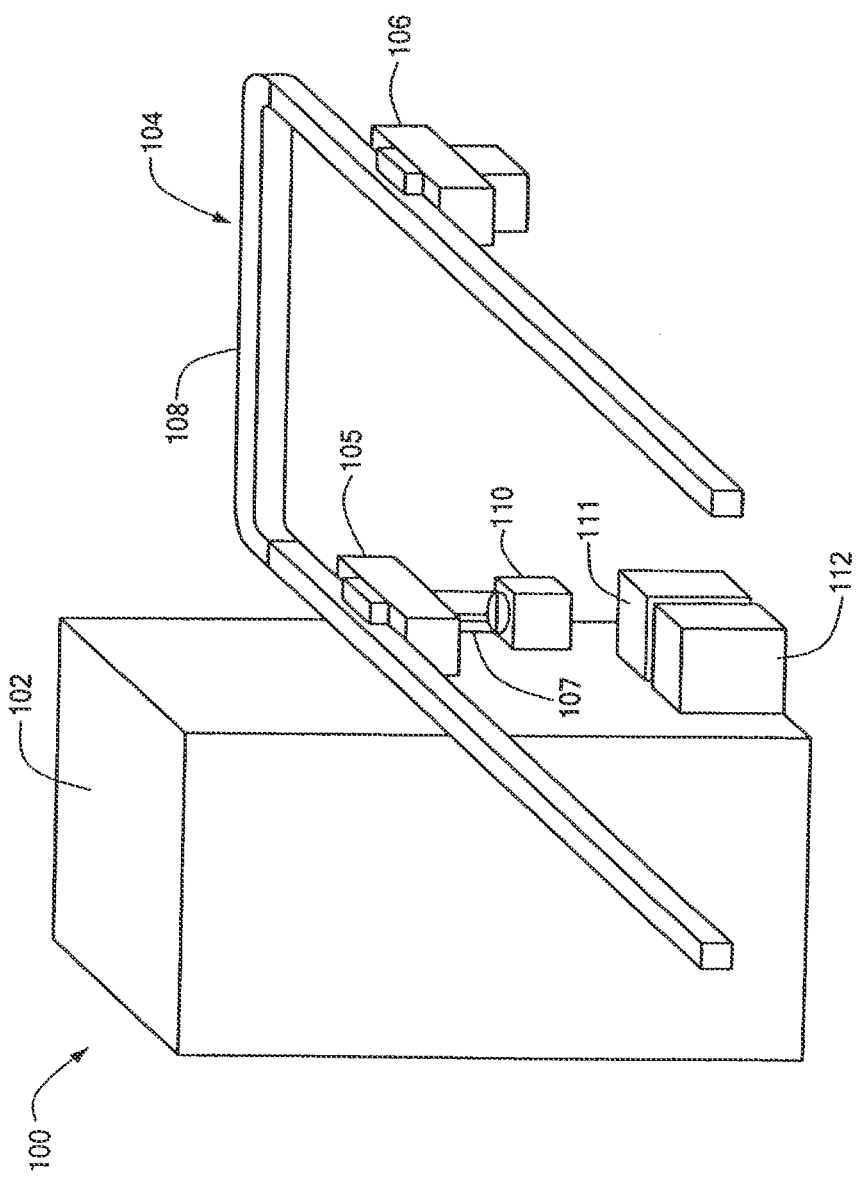
FIG. 1 is a perspective view of a conventional automated material handling system.

FIG. 1 depicts a conventional AMHS 100, which may be employed to automatically store and transport WIP parts between various workstations and/or processing machines in a product manufacturing environment, e.g., a clean environment for manufacturing Integrated Circuit (IC) chips. As shown in FIG. 1, the conventional AMHS 100 comprises a WIP storage unit ("stocker") 102 and an overhead hoist transport subsystem 104. The WIP stocker 102 includes input and output ports 111-112, and the overhead hoist transport subsystem 104 includes a suspended track 108 and a plurality of overhead hoist transport vehicles 105-106 configured to travel on the track 108. In a typical mode of operation, the WIP parts are transported in a cassette pod 110 such as a Front Opening Unified Pod (FOUP). The first overhead transport vehicle 105 travels along the track 108 and stops at a position suitable for unloading the FOUP 110 into the input port 111 or for loading another FOUP from the output port 112 of the stocker 102. Further, the second overhead transport vehicle 106 waits on the track 108 until the first overhead transport vehicle 105 finishes unloading/loading the FOUP and moves out of the way.

In the conventional AMHS 100, FOUPs are unloaded from the overhead hoist into the input port 111, loaded from the output port 112 into the overhead hoist, or otherwise accessed from within the stocker 102 by a robotic arm 107, which may provide up to three or more axes of movement. Further, the minimum amount of time required to access the FOUPs from the stocker 102 generally determines the stocker throughput, which dictates the number of stockers needed to support the desired production level. Accordingly, complex movements of the multi-axis robotic arm 107 for accessing the FOUPs may cause the minimum move time to increase, thereby increasing both the number of stockers needed in the AMHS 100 and the overall cost of the material handling system.

Figure 2:
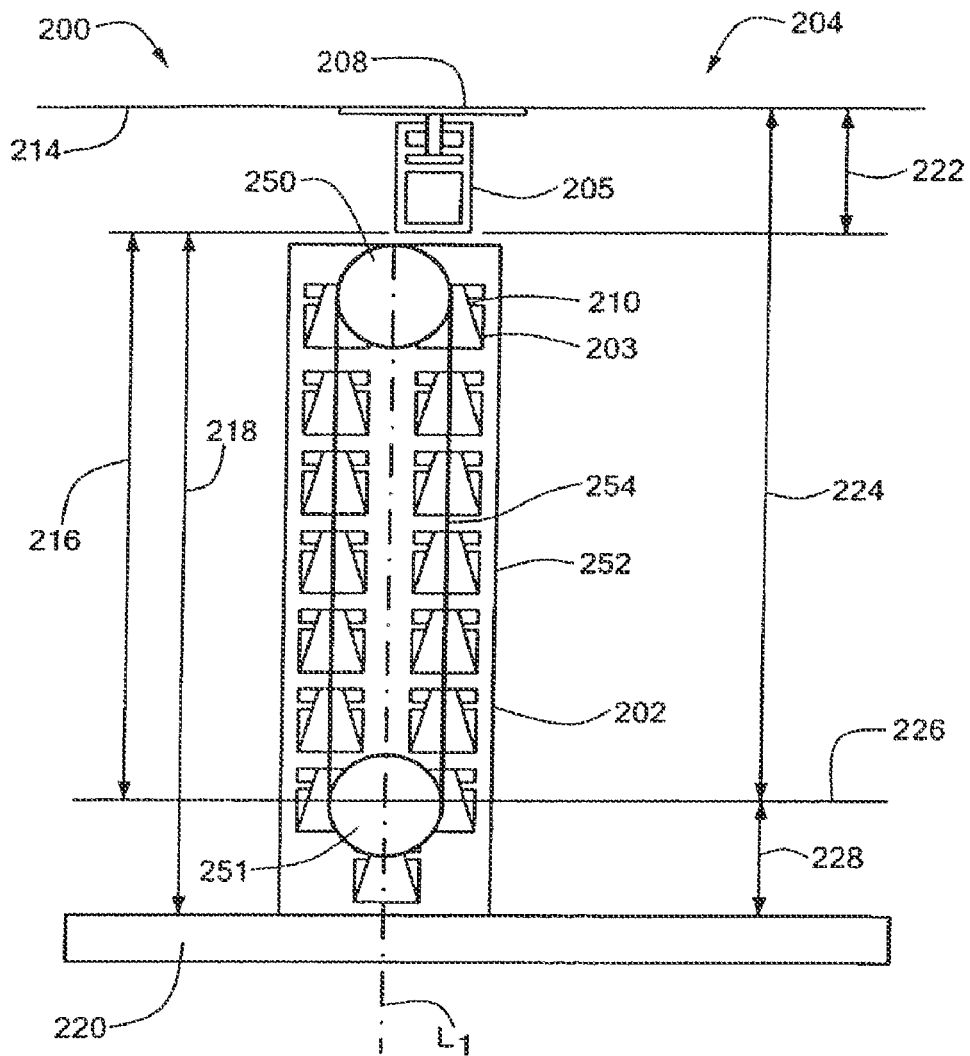
FIG. 2 is block diagram of a first embodiment of an automated material handling system according to the present invention.

FIG. 2 depicts an illustrative embodiment of an Automated Material Handling System (AMHS) 200, in accordance with the present invention. In the illustrated embodiment, the AMHS 200 comprises an overhead hoist transport subsystem 204, and at least one vertical carousel WIP storage unit ("stocker") 202 including a plurality of storage bins such as a carousel storage bin 203. The vertical carousel WIP stocker 202 is configured to allow an overhead hoist in the overhead hoist transport subsystem 204 to access WIP parts directly from a selected one of the carousel storage bins.

It is noted that like the conventional AMHS 100 (see FIG. 1), the AMHS 200 of FIG. 2 may be employed in a clean environment for manufacturing IC chips such as a 200 mm or 300 mm FAB plant, or any other suitable product manufacturing environment. As shown in FIG. 2, the IC chip manufacturing environment includes first and second floors 220 and 226, and a ceiling 214. The first floor 220 typically comprises a waffle slab made of reinforced concrete, and the second floor 226 comprises a raised floor located above the waffle slab 220. The vertical carousel stocker 202 is positioned on the waffle slab 220. Further, workstations and/or processing machines (not shown) configured to perform various process steps for fabricating the IC chips are positioned on the raised floor 226, which is typically covered with an electrically nonconductive material and designed to meet specific loading and seismic requirements. For example, the raised floor 226 may be located a distance 228 (about 0.6 m) above the waffle slab 220 and a distance 224 (greater than or equal to about 4.15 m) below the ceiling 214.

In the presently disclosed embodiment, the vertical carousel stocker 202 includes a housing 252, and first and second pulleys 250-251 and a belt 254 disposed within the housing 252. As shown in FIG. 2, the carousel storage bins (e.g., the storage bin 203) are coupled to the belt 254 at various spaced locations along the belt, and the belt 254 is looped between the first and second pulleys 250-251 to allow the storage bins to be rotatably positioned along the belt path by driving one of the pulleys 250-251. For example, the vertical carousel stocker 202 may have a height 218 (about 3.85 m). The top of the vertical carousel stocker 202 may therefore be a distance 216 (about 3.25 m) above the raised floor 226.

As described above, the vertical carousel stocker 202 is configured to allow an overhead hoist to access WIP parts, e.g., semiconductor wafers, directly from one of the carousel storage bins. In the illustrated embodiment, the portion of the stocker housing 252 near the ceiling 214 is at least partially open to allow top-loading/unloading of the selected carousel storage bin. Further, each carousel storage bin comprises a fixed shelf, and the semiconductor wafers are loaded into cassette pods such as a Front Opening Unified Pod (FOUP) 210 disposed on the shelf 203. For example, each FOUP 210 may hold one or more semiconductor wafer lots, thereby allowing the overhead hoist to access multiple wafer lots in a single carousel storage bin simultaneously.

The overhead hoist transport subsystem 204 includes a suspended track 208 and at least one overhead hoist transport vehicle 205 configured for traveling on the track 208. The suspended track 208 defines at least one predetermined route passing over the vertical carousel stocker 202, thereby allowing the overhead transport vehicle 205 to access a FOUP directly from one of the carousel storage bins positioned approximately at the top of the stocker 202. For example, the overhead transport vehicle 205 may extend a distance 222 (about 0.9 m) from the ceiling 214.

In an illustrative mode of operation, the selected carousel storage bin, e.g., the storage bin 203 containing the FOUP 210, is positioned approximately at the top of the vertical carousel stocker 202 underneath the track 208. The overhead transport vehicle 205 is then moved along the track 208 to a position substantially directly above the storage bin 203. Next, the overhead hoist is lowered from the overhead transport vehicle 205 through the opening in the stocker housing 252 toward the storage bin 203. For example, the overhead hoist may be lowered in a direction parallel to the longitudinal axis $L_1$ of the stocker. The overhead hoist is then operated to pick the FOUP 210 directly from the storage bin 203 for subsequent transport to a workstation or processing machine on the IC chip manufacturing floor. It is understood that the overhead hoist may alternatively be operated to place a FOUP in the carousel storage bin 203.

Figure 3:
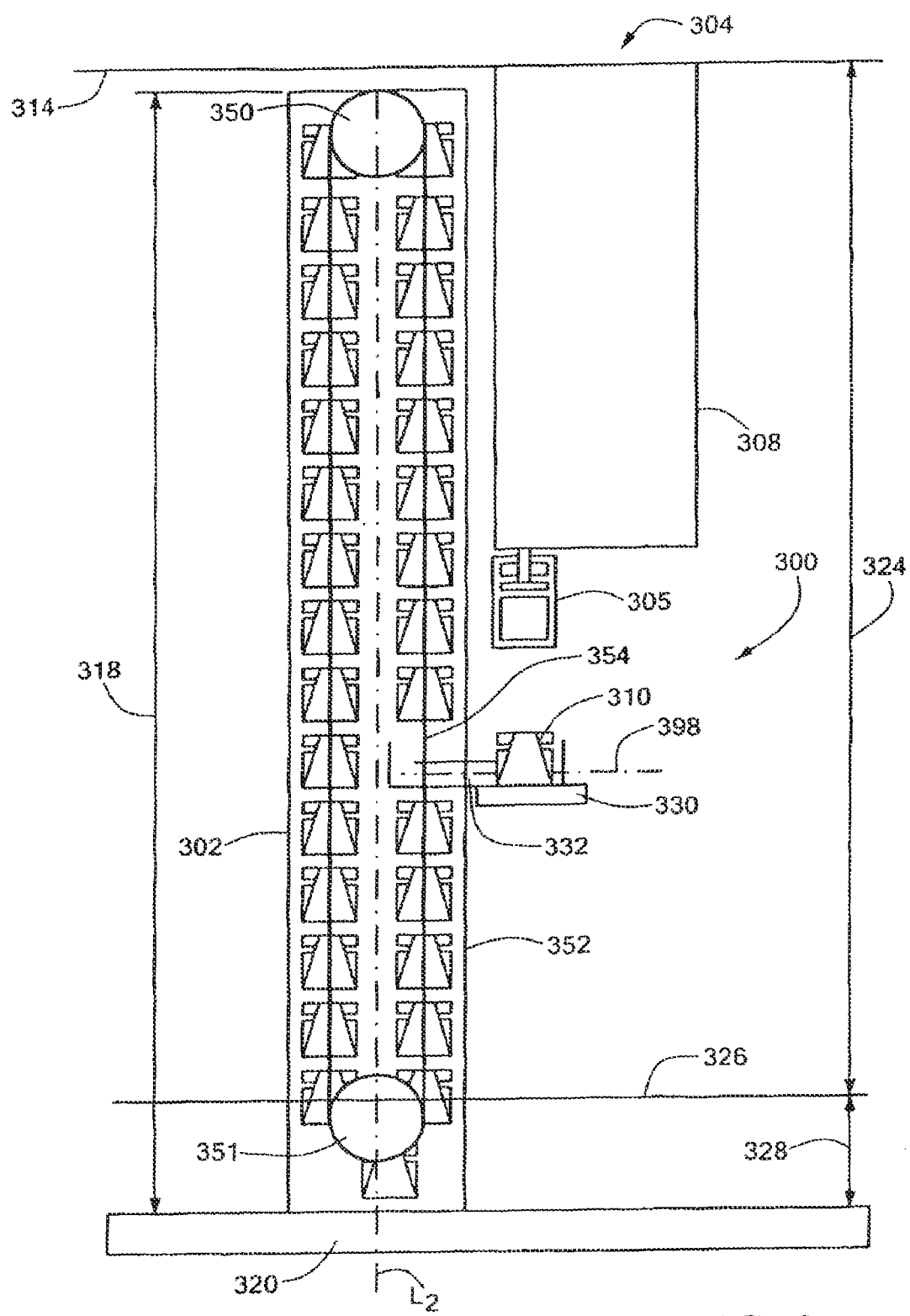
FIG. 3 is a block diagram of a second embodiment of the automated material handling system of FIG. 2.

FIG. 3 depicts an alternative embodiment 300 of the AMHS 200 (see FIG. 2). As shown in FIG. 3, the AMHS 300 comprises an overhead hoist transport system 304, and at least one vertical carousel WIP stocker 302 including a plurality of storage bins such as a slide-mounted storage bin 332. Like the vertical carousel stocker 202, the vertical carousel stocker 302 is configured to allow an overhead hoist in the overhead hoist transport system 304 to access WIP parts, e.g., semiconductor wafers, directly from a selected one of the carousel storage bins.

Specifically, the AMHS 300 may be employed in an IC chip manufacturing environment including a ceiling 314, a waffle slab 320, and a raised floor 326 located above the waffle slab 320. As shown in FIG. 3, the vertical carousel stocker 302 is positioned on the waffle slab 320. For example, the raised floor 326 may be located a distance 328 (about 0.6 m) above the waffle slab 320 and a distance 324 (greater than about 5.4 m) below the ceiling 314. Further, the vertical carousel stocker 302 includes a housing 352, and first and second pulleys 350-351 and a belt 354 disposed within the housing 352. The carousel storage bins (e.g., the slide-mounted storage bin 332) are coupleable to the belt 354 at various spaced locations along the belt, and the belt 354 is looped between the first and second pulleys 350-351 to allow the storage bins to be rotatably positioned along the belt path by driving one of the pulleys 350-351. For example, the vertical carousel stocker 302 may have a height 318 (about 6 m).

As described above, the vertical carousel stocker 302 is configured to allow an overhead hoist to access the semiconductor wafers directly from one of the carousel storage bins. In the illustrated embodiment, at least one side of the housing 352 is at least partially open to allow the selected carousel storage bin to be extracted from within the housing 352, and to allow subsequent top-loading/unloading of the selected storage bin by the overhead hoist. Specifically, the AMHS 300 further includes at least one extraction mechanism 330, which works to extract the semiconductor wafers from within the stocker 302, and to suitably position the material relative to a suspended track 308 included in the overhead hoist transport subsystem 304. It is noted that each storage bin may comprise either a movable or fixed shelf. Further, the semiconductor wafers are loaded into cassette pods such as a FOUP 310 disposed on the shelf 332.

The overhead hoist transport subsystem 304 includes the suspended track 308 and at least one overhead hoist transport vehicle 305 configured to travel on the track 308. The track 308 defines at least one predetermined route passing parallel to the vertical carousel stocker 302, thereby allowing the overhead transport vehicle 305 to access a FOUP directly from a selected one of the slide-mounted storage bins.

In an illustrative mode of operation, the selected slide-mounted storage bin, e.g., the storage bin 332 containing the FOUP 310, is positioned to allow the extraction mechanism 330 to extract the storage bin 332 from within the stocker 302 and to position the storage bin 332 directly underneath the track 308. It is noted that the extraction mechanism 330 may be incorporated into the stocker 302 and configured to move the storage bin 332 along a single servo-controlled axis 398. The overhead transport vehicle 305 is then moved along the track 308 to a position directly above the extracted storage bin 332. Next, the overhead hoist is lowered from the overhead transport vehicle 305 toward the storage bin 332, e.g., in a direction parallel to the longitudinal axis $L_2$ of the stocker. The overhead hoist is then operated to pick the FOUP 310 directly from the storage bin 332 for subsequent transport to a workstation or processing machine on the IC chip manufacturing floor. It is appreciated that the overhead hoist may alternatively be operated to place a FOUP in the carousel storage bin 332.

Figure 4:
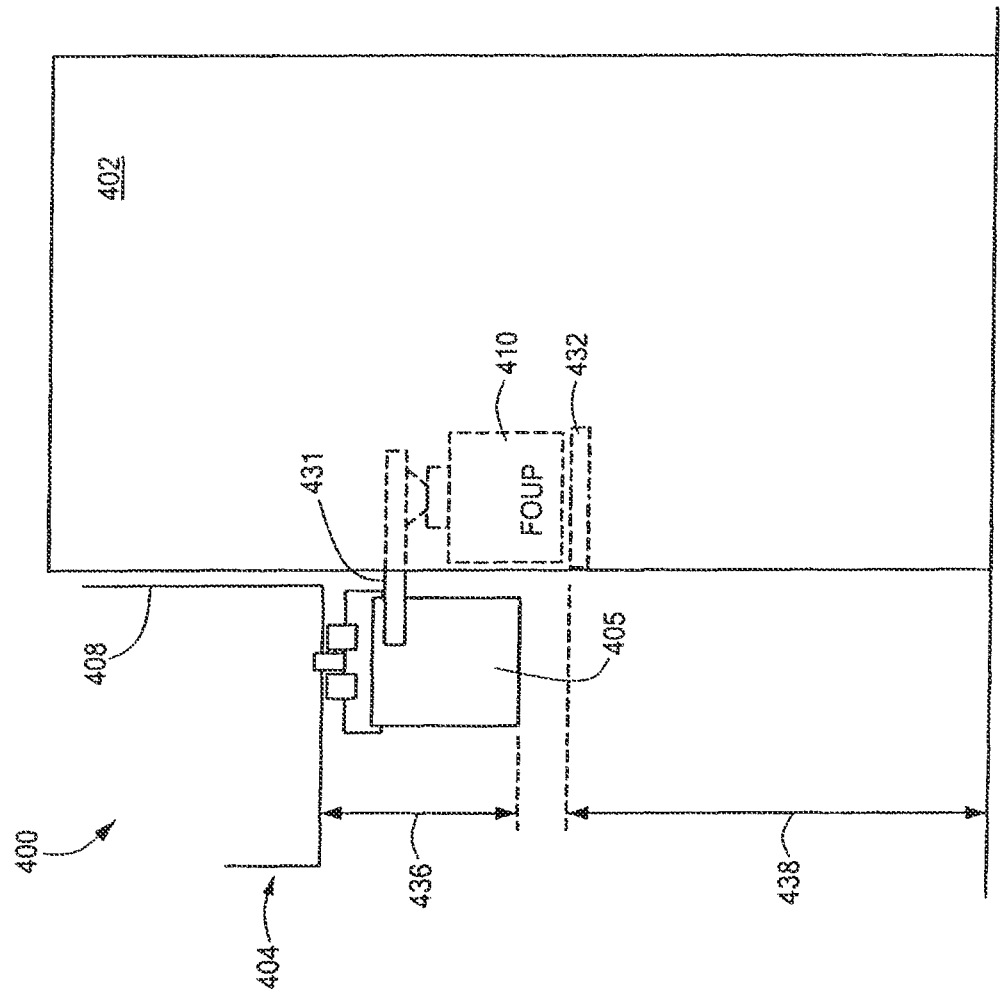
FIG. 4 is a block diagram of a third embodiment of the automated material handling system of FIG. 2.

FIG. 4 depicts a detailed embodiment 400 of the AMHS 300 (see FIG. 3). In the illustrated embodiment, the AMHS 400 comprises an overhead hoist transport system 404 and a vertical carousel stocker 402. The overhead hoist transport system 404 includes a suspended track 408 and an overhead hoist transport vehicle 405 configured for traveling on the track 408. For example, the overhead transport vehicle 405 may extend a distance 436 (about 0.9 m) from the track 408. The vertical carousel stocker 402 includes a plurality of carousel storage bins such as a storage bin 432 disposed within the stocker housing. For example, the storage bin 432 may be a distance 438 (about 2.6 m) above the raised IC chip manufacturing floor.

As described above, a FOUP 410 is extracted from within the stocker housing to allow subsequent top-loading/unloading of the selected storage bin. The overhead transport vehicle 405 further includes an overhead hoist 431 having a gripper configured to top-load/unload the FOUP 410 to/from the storage bin 432. In the preferred embodiment, the hoist gripper 430 is mounted on a translating stage to allow the overhead hoist to pick/place a cassette pod to either side of the overhead transport vehicle 405.

Figure 5:
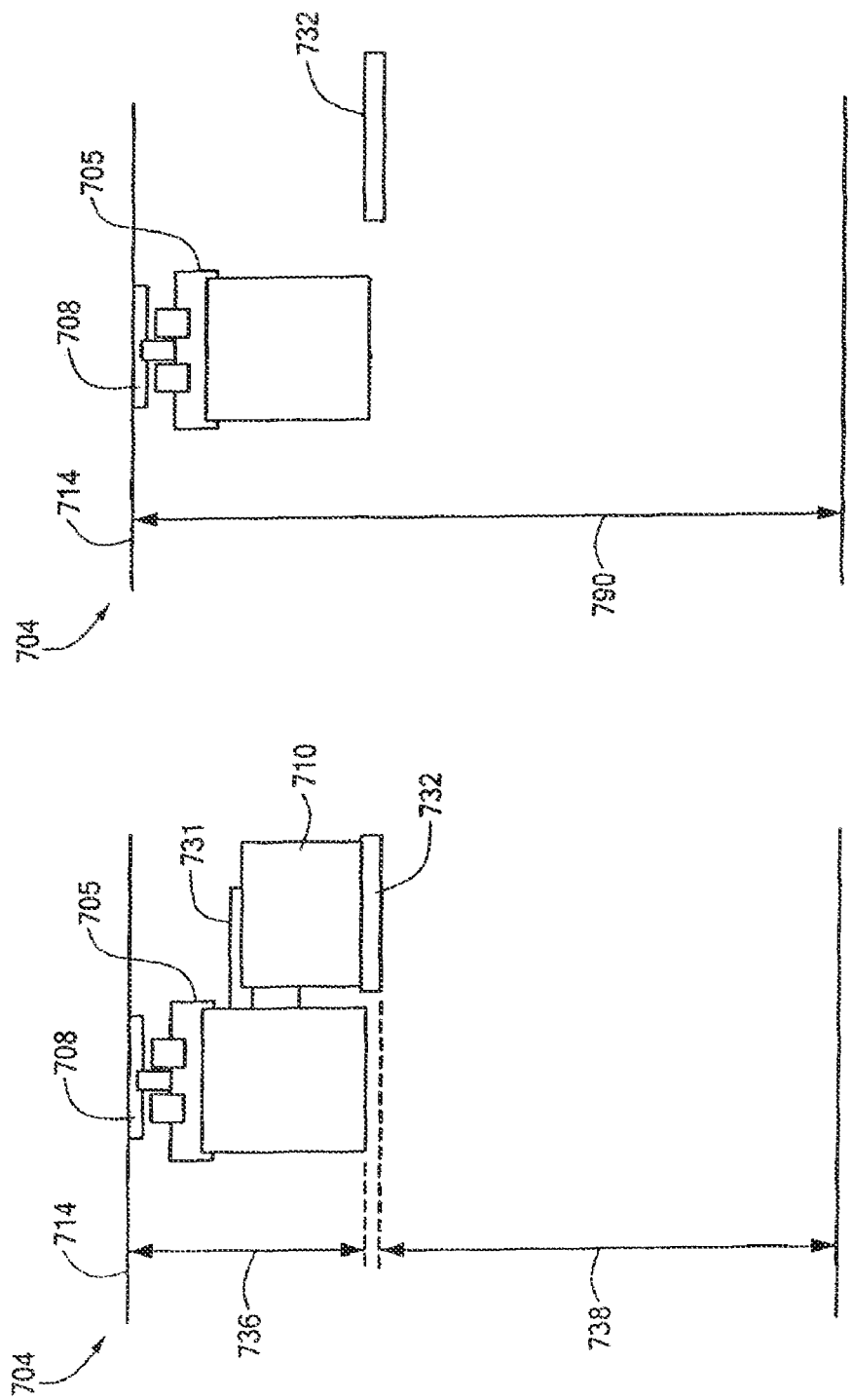
FIGS. 5a-5b are block diagrams of a translating hoist vehicle accessing fixed storage positions according to the present invention.

FIGS. 5a-5b depict a translating hoist vehicle subsystem 704 accessing fixed storage positions. In the illustrated embodiment, the translating hoist vehicle subsystem 704 includes a suspended track 708, and an overhead hoist transport vehicle 705 configured to travel on the track. The overhead transport vehicle 705 is configured to pick/place a FOUP 710 to a fixed storage position 732. For example, the overhead transport vehicle 705 may extend a distance 736 (about 0.9 m) below the ceiling 714, and the storage position 732 may be disposed a distance 738 (about 2.6 m) above the raised IC chip manufacturing floor. Further, the ceiling 714 may be a distance 790 (about 3.66 m) above the raised floor.

The overhead transport vehicle 705 is configured to pick (and place) the FOUP 710 to a position located directly below the suspended track 708. To that end, the overhead hoist vehicle 705 includes a hoist gripper 731 mounted to a translating stage and configured to extend from the vehicle 705, pick up the FOUP 710, and retract back to the vehicle 705, thereby moving the FOUP 710 within the overhead transport vehicle 705 (see FIG. 5b). In the preferred embodiment, the translating stage is configured to allow the overhead hoist to pick/place a cassette pod to either side of the overhead transport vehicle 705. Once the FOUP 710 is held by the hoist gripper 730, the overhead transport vehicle 705 transports it to a workstation or processing machine on the IC chip manufacturing floor.

Figure 6:
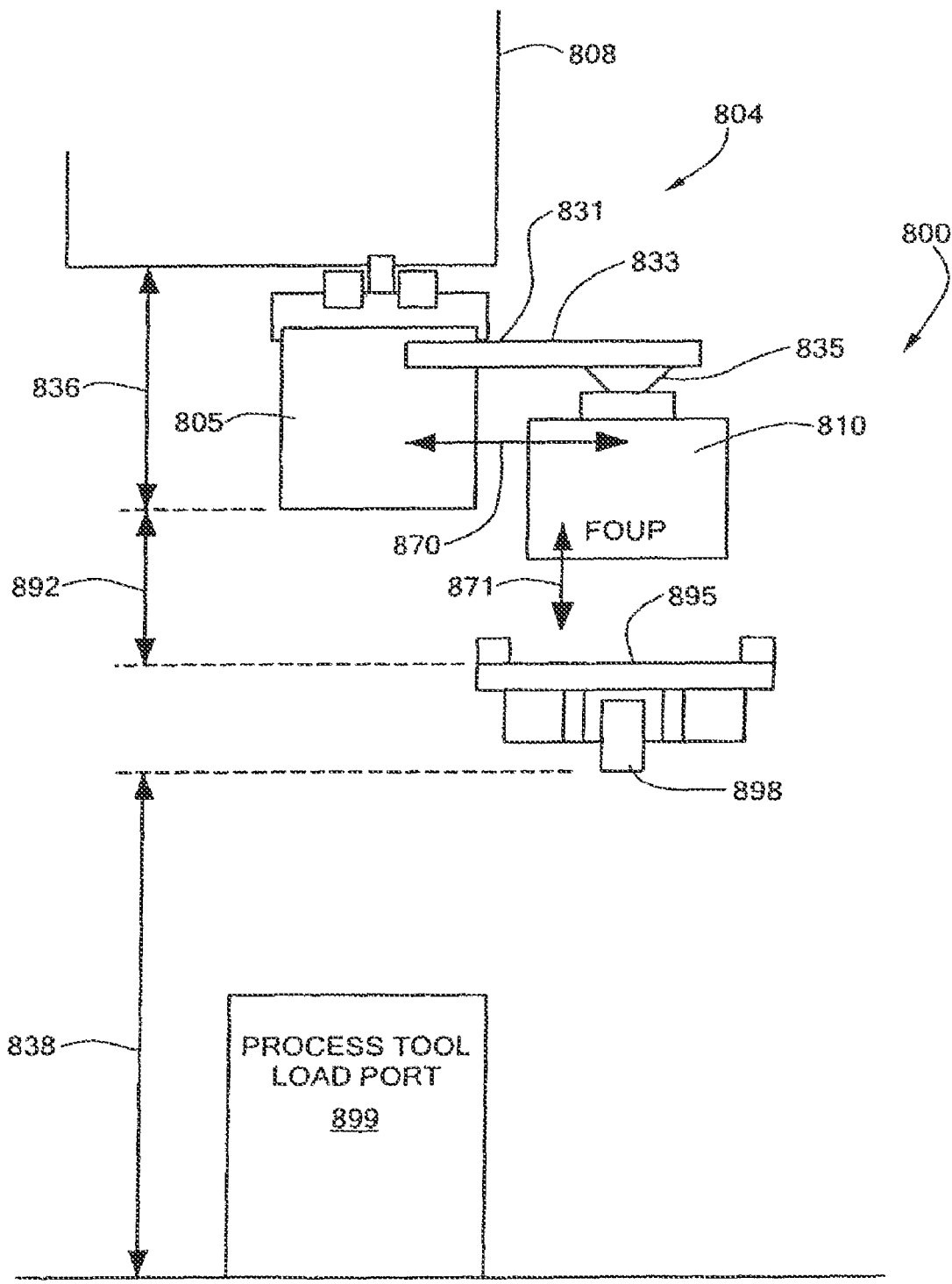
FIG. 6 is a block diagram of the translating hoist vehicle of FIGS. 5a-5b accessing material on a conveyer.

FIG. 6 depicts a translating hoist vehicle system 800 accessing material either stored or moving on a conveyer 895. Specifically, an overhead hoist transport subsystem 804 is employed to directly pick or place a FOUP 810 to the overhead rail-based conveyer 895. In the illustrated embodiment, the overhead hoist transport subsystem 804 includes a suspended track 808 and an overhead hoist transport vehicle 805 configured to travel on the track 808. For example, the overhead transport vehicle 805 may extend a distance 836 (about 0.9 m) below the track 808 and be disposed a distance 892 (about 0.35 m) above the rail-based conveyer 895. Further, the overhead rail 898 may be a distance 838 (about 2.6 m) above the raised IC manufacturing floor. It should be understood that the rail 898 extends in a direction perpendicular to the plane of the drawing. The translating hoist vehicle system 800 further includes a process tool load port 899.

The overhead transport vehicle 805 may be employed to perform top-loading/unloading of the rail-based conveyer 895. To that end, the overhead transport vehicle 805 includes an overhead hoist 831 having a hoist gripper 835, which is mounted to a translating stage 833 configured to allow both horizontal and vertical motion, as indicated by the directional arrows 870 and 871, respectively. In an illustrative mode of operation, the rail-based conveyer 895 is moved so that the FOUP 810 is positioned directly underneath the overhead hoist 831. The hoist gripper 835 is then lowered via the translating stage 833 toward the FOUP 810, and operated to pick the FOUP 810 directly from the conveyer 895. Next, the hoist gripper 835 carrying the FOUP 810 is raised and retracted via the translating stage 833, thereby moving the FOUP 810 within the overhead transport vehicle 805. The transport vehicle 805 then transports the FOUP 810 to a workstation or processing machine on the IC chip manufacturing floor.

Figure 7:
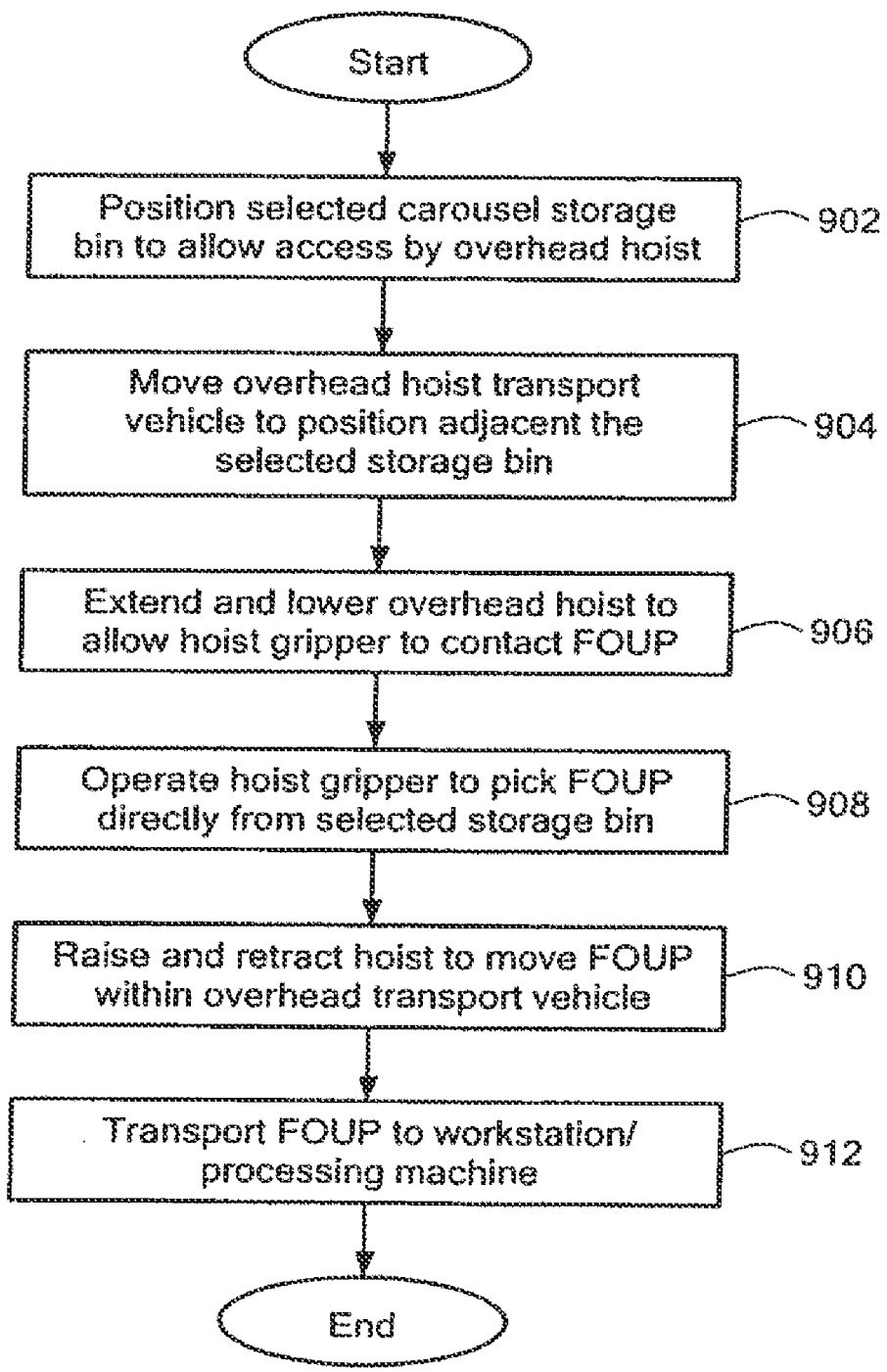
FIG. 7 is a flow diagram of a method of operating the automated material handling system of FIG. 2.

A method of operating the presently disclosed automated material handling system is illustrated by reference to FIG. 7. As depicted in step 902, a selected storage bin containing a FOUP is positioned within a vertical carousel stocker to allow access by an overhead hoist. For example, the selected carousel storage bin may be positioned at the top or at the side of the vertical carousel stocker (see FIGS. 2-3). Next, the overhead hoist transport vehicle is moved along a track, as depicted in step 904, to a position adjacent the selected storage bin. In the event the selected storage bin is positioned at the top of the stocker, the overhead transport vehicle is positioned above the storage bin. In the event the selected storage bin is positioned at the side of the stocker, the overhead transport vehicle is positioned to the side of the storage bin. The overhead hoist is then extended from the transport vehicle and lowered, as depicted in step 906, to allow the hoist gripper to contact the FOUP in the selected storage bin. Next, the hoist gripper is operated, as depicted in step 908, to pick the FOUP directly from the storage bin. The overhead hoist is then raised and retracted, as depicted in step 910, to move the FOUP within the overhead transport vehicle. In this way, the FOUP is top-loaded from the selected storage bin to the overhead transport vehicle. Finally, the overhead transport vehicle transports, as depicted in step 912, the FOUP to a workstation or processing machine on the product manufacturing floor.

It will further be appreciated by those of ordinary skill in the art that modifications to and variations of the above-described automated material handling system may be made without departing from the inventive concepts disclosed herein. Accordingly, the invention should not be viewed as limited except as by the scope and spirit of the appended claims.

What is claimed is:

1. An automated material handling system comprising:
   an overhead hoist transport subsystem comprising at least one overhead hoist and at least one overhead hoist transport vehicle, the at least one overhead hoist comprising a translating stage and a gripper portion coupled to the translating stage, the gripper portion being configured to grip a material unit;
   wherein the translating stage is configured to vertically move the gripper portion configured to grip the material unit from a first position proximate to the at least one overhead hoist transport vehicle to at least one of a second position proximate to a load port and a third position proximate to a storage location;
   wherein the overhead hoist transport subsystem is configured to load the material unit on at least one of the load port and the storage location;
   wherein the load port is beneath an overhead rail; and
   wherein at least a portion of the storage location is disposed lateral to the overhead rail.

2. The automated material handling system of claim 1, wherein the material unit comprises a cassette pod.

3. The automated material handling system of claim 1, wherein the gripper portion is further configured to move in a downwards vertical direction towards the load port and to place the material unit on the load port.

4. The automated material handling system of claim 3, wherein the gripper portion is further configured to retract to a starting position after placing the material unit on the load port.

5. The automated material handling system of claim 1, wherein the gripper portion is further configured to move in a downwards vertical direction towards the storage location and to place the material unit on the storage location.

6. The automated material handling system of claim 5, wherein the gripper portion is further configured to retract to a starting position after placing the material unit on the storage location.

7. The automated material handling system of claim 1, wherein the load port is disposed on an integrated circuit chip manufacturing floor.

8. The automated material handling system of claim 1, wherein the at least one overhead hoist transport vehicle is configured to extend a first distance below an integrated circuit chip manufacturing ceiling and a second distance above an integrated circuit chip manufacturing floor, with the load port being substantially disposed at the second distance from the integrated circuit chip manufacturing floor and at the first distance from the integrated circuit chip manufacturing floor ceiling.

9. An automated material handling system comprising:
an overhead hoist transport subsystem comprising at least one overhead hoist and at least one overhead hoist transport vehicle, the at least one overhead hoist comprising a translating stage and a gripper portion coupled to the translating stage, the gripper portion being configured to grip a material unit;
wherein the translating stage is configured to vertically move the gripper portion configured to grip the material unit from a first position proximate to the at least one overhead hoist transport vehicle to at least one of a second position proximate to a load port and a third position proximate to a conveyer;
wherein the overhead hoist transport subsystem is configured to load the material unit on at least one of the load port and the conveyer;
wherein the load port is beneath an overhead rail; and
wherein at least a portion of the conveyer is disposed lateral to the overhead rail.

10. The automated material handling system of claim 9, wherein the material unit comprises a cassette pod.

11. The automated material handling system of claim 9, wherein the gripper portion is further configured to move in a downwards vertical direction towards the conveyer and to place the material unit on the conveyer.

12. The automated material handling system of claim 11, wherein the gripper portion is further configured to retract to a starting position after placing the material unit on the conveyer.

13. The automated material handling system of claim 9, wherein the gripper portion is further configured to move in a downwards vertical direction towards the load port and to place the material unit on the load port.

14. The automated material handling system of claim 13, wherein the gripper portion is further configured to retract to a starting position after placing the material unit on the load port.

15. A method of operating an automated material handling system, the method comprising:
carrying an overhead hoist and at least one overhead hoist transport vehicle to at least one of a first position proximate to a load port and a second position proximate to a storage location, with the at least one overhead hoist transport vehicle comprising a translating stage and a gripper portion coupled to the translating stage, with the gripper portion configured to grip a material unit;
vertically moving the gripper portion and the translating stage downward to at least one of a third position above the load port and a fourth position above the storage location; and
loading the material unit on at least one of the load port and the storage location;
wherein the load port is beneath an overhead rail; and
wherein at least a portion of the storage location is disposed lateral to the overhead rail.

16. The method of claim 15, wherein the material unit comprises a cassette pod.

17. The method of claim 15, further comprising:
retracting the gripper portion to a starting position after loading the material unit on the at least one of the load port and the storage location.

18. The method of claim 15, wherein the load port is disposed on an integrated circuit chip manufacturing floor.

19. The method of claim 15, wherein loading the material unit comprises:
placing the material unit on the storage location by releasing the material unit from the gripper portion.

20. The method of claim 15, wherein loading the material unit further comprises:
placing the material unit on the load port by releasing the material unit from the gripper portion.

* * * * *

UNITED STATES PATENT AND TRADEMARK OFFICE
CERTIFICATE OF CORRECTION

PATENT NO.         : 8,197,172 B2                                            Page 1 of 1
APPLICATION NO.    : 12/724194
DATED              : June 12, 2012
INVENTOR(S)        : Brian J. Doherty, Thomas R. Mariano and Robert P. Sullivan It is certified that error appears in the above-identified patent and that said Letters Patent is hereby corrected as shown below:

On the Title page:

Item (56) Reference Cited, in Column 2 (Other Publications), delete "Advance dSemiconductor" and insert --Advanced Semiconductor--, therefor.

In the Specifications:

Column 1, Line 10, delete "7,771,153 11/652,707," and insert --7,771,153,--, therefor.

Column 1, Line 16, delete "7,165,927 10/393,526," and insert --7,165,927,--, therefor.

Column 10, Line 44, in Claim 20, after "unit" delete "further.".

Signed and Sealed this
Fourth Day of September, 2012

David J. Kappos
*Director of the United States Patent and Trademark Office*